United States Patent
Han

(10) Patent No.: US 12,100,440 B2
(45) Date of Patent: Sep. 24, 2024

(54) SENSE AMPLIFIER CIRCUIT, METHOD FOR OPERATING SAME, AND FABRICATION METHOD FOR SAME

(71) Applicant: Changxin Memory Technologies, Inc., Anhui (CN)

(72) Inventor: Qinghua Han, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 198 days.

(21) Appl. No.: 17/828,273

(22) Filed: May 31, 2022

(65) Prior Publication Data
US 2023/0253030 A1   Aug. 10, 2023

Related U.S. Application Data

(63) Continuation of application No. PCT/CN2022/080790, filed on Mar. 14, 2022.

(30) Foreign Application Priority Data

Feb. 8, 2022   (CN) .......................... 202210117843.4

(51) Int. Cl.
*G11C 11/40*     (2006.01)
*G11C 11/4091*   (2006.01)
*H10B 12/00*     (2023.01)

(52) U.S. Cl.
CPC .......... *G11C 11/4091* (2013.01); *H10B 12/09* (2023.02)

(58) Field of Classification Search
CPC .......... G11C 11/4091; G11C 2207/063; G11C 7/062; H10B 12/09; H10B 12/482
See application file for complete search history.

(56) References Cited

U.S. PATENT DOCUMENTS 5,432,736 A * 7/1995 Wong ...................... G11C 11/41
                                                    365/189.11
6,064,452 A   5/2000 Ogina
(Continued)

FOREIGN PATENT DOCUMENTS

CN    1092898 A    9/1994
CN    107086051 A  8/2017
(Continued)

OTHER PUBLICATIONS

PCT International Search Report and the Written Opinion mailed Oct. 31, 2022, issued in related International Application No. PCT/CN2022/080790, with English translation (18 pages).

*Primary Examiner* — Uyen Smet
(74) *Attorney, Agent, or Firm* — Sheppard Mullin Richter & Hampton LLP

(57) ABSTRACT

The invention provides a sense amplifier circuit, a method for operating same, and a fabrication method for same. The sense amplifier circuit includes: an amplifier electrically connected to a memory cell of a semiconductor memory; and a pre-amplifier located between the amplifier and the memory cell, where the pre-amplifier is configured to pre-amplify an electrical signal transmitted from the memory cell to the amplifier. In this way, the pre-amplifier is provided between the amplifier and the memory cell, such that the electrical signal stored in the semiconductor memory can be output after two stages of amplification by the pre-amplifier and the amplifier, thereby avoiding the problem that the electrical signal output from the memory cell cannot be accurately received and output in a case of a small sense margin of a signal of the sense amplifier.

19 Claims, 8 Drawing Sheets

(56) References Cited

U.S. PATENT DOCUMENTS

| | | | |
|---|---|---|---|
| 7,023,751 B2* | 4/2006 | Kirsch | G11C 11/406 |
| | | | 365/177 |
| 9,922,695 B2 | 3/2018 | Tomishima et al. | |
| 2011/0026347 A1* | 2/2011 | Fort | G11C 7/065 |
| | | | 365/207 |
| 2020/0194088 A1 | 6/2020 | Maejima et al. | |
| 2020/0273513 A1 | 8/2020 | Katayama | |
| 2021/0028176 A1* | 1/2021 | Derner | H01L 29/78642 |
| 2021/0183425 A1 | 6/2021 | Takizawa | |
| 2022/0028434 A1 | 1/2022 | Choi et al. | |

FOREIGN PATENT DOCUMENTS

| | | |
|---|---|---|
| CN | 107258000 A | 10/2017 |
| CN | 111613256 A | 9/2020 |
| CN | 112951286 A | 6/2021 |
| IN | 111755045 A | 10/2020 |
| JP | 2005-303231 A | 10/2005 |

\* cited by examiner

Cutting line

SENSE AMPLIFIER CIRCUIT, METHOD FOR OPERATING SAME, AND FABRICATION METHOD FOR SAME

CROSS-REFERENCE TO RELATED APPLICATIONS

This application is a continuation application of International Patent Application No. PCT/CN2022/080790, filed on Mar. 14, 2022, which claims priority to Chinese Patent Application No. 202210117843.4, filed with the China National Intellectual Property Administration on Feb. 8, 2022, and entitled "SENSE AMPLIFIER CIRCUIT, METHOD FOR OPERATING SAME, AND FABRICATION METHOD FOR SAME." The above-referenced applications are incorporated herein by reference in their entirety.

TECHNICAL FIELD

The invention relates to memory technologies, and in particular, to a sense amplifier circuit, a method for operating same, and a fabrication method for same.

BACKGROUND

At present, miniaturization of semiconductor memories has become a development trend for semiconductor devices. However, continuous downsizing of the semiconductor memories also has some adverse effects.

For example, when the cell area in a semiconductor memory is continuously downsized, the sense voltage difference supplied by the memory device to the sense amplifier in the semiconductor memory also becomes increasingly small, causing a decrease or even disappearance of a sense margin of the sense amplifier and thus making data obtained from the semiconductor memory inaccurate.

SUMMARY

The invention provides a sense amplifier circuit, a method for operating same, and a fabrication method for same, so as to address a threshold voltage mismatch that easily occurs when the sense amplifier has a small size in the case of scaling down a semiconductor memory, as well as a decrease or even disappearance of a sense margin of the sense amplifier due to a small voltage difference supplied to the sense amplifier when a memory cell in the semiconductor memory has a small size.

According to a first aspect, the invention provides a sense amplifier circuit, including: an amplifier electrically connected to a memory cell of a semiconductor memory; and a pre-amplifier located between the amplifier and the memory cell, where the pre-amplifier is configured to pre-amplify an electrical signal transmitted from the memory cell to the amplifier.

In a possible implementation, the amplifier is electrically connected to a bit line corresponding to the memory cell and a reference bit line of the bit line.

In a possible implementation, the pre-amplifier includes: a first transistor, with a base of the first transistor connected to the memory cell, and an emitter of the first transistor connected to a first voltage reference; and a second transistor, with a base of the second transistor connected to a collector of the first transistor, an emitter of the second transistor connected to a second voltage reference, and a collector of the second transistor connected to the amplifier.

In a possible implementation, the first transistor is a PNP transistor, and the second transistor is an NPN transistor.

In a possible implementation, the first transistor is an NPN transistor, and the second transistor is a PNP transistor.

According to a second aspect, the invention provides a method for operating the sense amplifier circuit described in the first aspect, the method including: when the memory cell is selected, adjusting an electrical connection line between the amplifier and the memory cell to float to a first voltage, where the first voltage has a voltage difference with respect to a predetermined voltage of the amplifier; the pre-amplifier stops operating under the action of the first voltage and a first superimposed voltage, where the first superimposed voltage is obtained by superimposing a first storage signal on the first voltage; and a second superimposed voltage is used to control the pre-amplifier to start operating such that the pre-amplifier pre-amplifies an electrical signal transmitted from the memory cell to the amplifier, where the second superimposed voltage is obtained by superimposing a second storage signal on the first voltage.

In a possible implementation, the method further includes: when the memory cell is not selected, keeping the electrical connection line between the amplifier and the memory cell at a predetermined voltage.

In a possible implementation, the amplifier is electrically connected to a bit line corresponding to the memory cell and a reference bit line; and adjusting the electrical connection line between the amplifier and the memory cell to float to the first voltage, where the first voltage has a voltage difference with respect to a predetermined voltage of the amplifier, includes: adjusting a bit line voltage of the bit line of the memory cell to which the amplifier is electrically connected to float the bit line voltage to the first voltage, where the first voltage has a voltage difference with respect to the predetermined voltage of the reference bit line.

In a possible implementation, the pre-amplifier includes: a first transistor, with a base of the first transistor connected to the memory cell, and an emitter of the first transistor connected to a first voltage reference; and a second transistor, with a base of the second transistor connected to a collector of the first transistor, an emitter of the second transistor connected to a second voltage reference, and a collector of the second transistor connected to the amplifier; and adjusting the electrical connection line between the amplifier and the memory cell to float to the first voltage includes: in a reading phase, when the memory cell is selected, floating the electrical connection line to be at the first voltage; adjusting a voltage of the first voltage reference to reverse bias the first transistor in cooperation with the first superimposed voltage; forward biasing the first transistor in cooperation with the second superimposed voltage; and adjusting the voltage of the first voltage reference and adjusting a voltage of the second voltage reference such that the voltage of the first voltage reference cooperates with the first superimposed voltage or the second superimposed voltage to reverse bias the first transistor, and the voltage of the second voltage reference cooperates with the first superimposed voltage to reverse bias the second transistor, or cooperates with the second superimposed voltage to forward bias the second transistor; in a writing phase, when a column in which the memory cell is located is selected, adjusting the voltage of the first voltage reference to reverse bias the first transistor in cooperation with a writing signal on the electrical connection line.

In a possible implementation, the first transistor is a PNP transistor, the second transistor is an NPN transistor, and the first voltage has a forward voltage difference with respect to the predetermined voltage.

In a possible implementation, the first transistor is an NPN transistor, the second transistor is a PNP transistor, and the first voltage has a reverse voltage difference with respect to the predetermined voltage.

In a possible implementation, voltage potentials of the first voltage reference and the second voltage reference are kept equal at a same time.

In a possible implementation, the memory cell includes: a capacitor and a switching transistor, where one terminal of the capacitor is connected to a second voltage, the other terminal of the capacitor is connected to one terminal of the switching transistor, a control terminal of the switching transistor is connected to a word line corresponding to the memory cell, and the other terminal of the switching transistor is connected to an amplifier and a pre-amplifier corresponding to a column in which the memory cell is located via a bit line corresponding to the column; and the method further includes: the first voltage has a forward voltage difference with respect to the predetermined voltage and the second voltage is greater than an average value of potentials corresponding to a first signal of the capacitor and a second signal of the capacitor; or the first voltage has a reverse voltage difference with respect to the predetermined voltage, and the second voltage is less than the average value of the potentials corresponding to the first signal of the capacitor and the second signal of the capacitor.

According to a third aspect, the invention provides a fabrication method for a sense amplifier circuit, the method including: forming a plurality of memory cells of a semiconductor memory arranged in an array; forming a plurality of sense amplifiers, where the plurality of sense amplifiers is electrically connected to the plurality of memory cells; and forming a plurality of pre-amplifiers, where the plurality of pre-amplifiers is located between the sense amplifier and the memory cell and configured to pre-amplify electrical signals transmitted from the plurality of memory cells to the plurality of sense amplifiers.

In a possible implementation, forming the plurality of memory cells of the semiconductor memory arranged in the array includes: forming a plurality of bit lines and a plurality of bit line lead-out regions corresponding to the plurality of bit lines, with the plurality of bit lines and the plurality of bit line lead-out regions extending along a first direction, and the plurality of bit lines connected to respective columns of the plurality of memory cells; and forming, on the plurality of bit lines, the plurality of memory cells; forming the plurality of sense amplifiers includes: forming the plurality of sense amplifiers, where the respective columns of the plurality of memory cells are in a one-to-one correspondence with the plurality of sense amplifiers; and forming the plurality of pre-amplifiers includes: forming the plurality of pre-amplifiers on the plurality of bit line lead-out regions, where the plurality of bit line lead-out regions is in a one-to-one correspondence with the plurality of pre-amplifiers, where input terminals of the plurality of pre-amplifiers are connected to bit lines in a corresponding column and output terminals of the plurality of pre-amplifiers, and the output terminals of the plurality of pre-amplifiers are connected to the bit lines, where the plurality of bit lines is connected to one terminals of the plurality of sense amplifiers, and the other terminals of the plurality of sense amplifiers are connected to a reference bit line of the plurality of bit lines.

In a possible implementation, forming the plurality of pre-amplifiers on the plurality of bit line lead-out regions includes: forming the plurality of pre-amplifiers including first transistors and second transistors on the plurality of bit line lead-out regions, where bases of the first transistors are connected to the plurality of memory cells, and emitters of the first transistors are connected to a first voltage reference, where bases of the second transistors are connected to collectors of the first transistors, emitters of the second transistors are connected to a second voltage reference, and collectors of the second transistors are connected to the plurality of sense amplifiers.

In a possible implementation, forming the plurality of bit lines and the plurality of bit line lead-out regions corresponding to the plurality of bit lines includes: forming a first well having a first conductivity type and a second well having a second conductivity type on a semiconductor substrate of a first conductivity type; forming the plurality of bit lines on the first well, and forming the plurality of bit line lead-out regions on the second well; and forming the plurality of pre-amplifiers in the plurality of bit line lead-out regions according to the steps of: in the bit line lead-out region, forming a first doped region having a fourth doped region and a second conductivity type, and a second doped region and a third doped region that are symmetrically located in the first doped region, where the first doped region, the second doped region, the third doped region, and the fourth doped region are isolated, and the second doped region, the third doped region, and the fourth doped region have the first conductivity type; and forming a first conductive plug corresponding to the second doped region, a second conductive plug corresponding to the third doped region, a third conductive plug corresponding to a first predetermined surface region of the bit line lead-out region, and a fourth conductive plug corresponding to a second predetermined surface region of the bit line lead-out region; forming a fifth conductive plug corresponding to a third predetermined surface region on bit lines corresponding to the plurality of bit line lead-out regions; and using the second well as the emitters, the plurality of bit line lead-out regions as the bases, and the first doped region as the emitters to constitute the first transistors; and using the first doped region as the bases, the second doped region as the emitters, and the third doped region as the collectors to constitute the second transistors.

In a possible implementation, if the first conductivity type is N-type, and the second conductivity type is P-type, the first transistor is a PNP transistor, and the second transistor is an NPN transistor; or if the first conductivity type is P-type, and the second conductivity type is N-type, the first transistor is an NPN transistor, and the second transistor is a PNP transistor.

In a possible implementation, the method further includes: forming three spaced metal layers, where the first metal layer covers the fifth conductive plug and the first conductive plug, the second metal layer covers the first conductive plug, and the third metal layer covers the second conductive plug and the fourth conductive plug.

The sense amplifier circuit provided in the invention includes: a sense amplifier electrically connected to a memory cell of a semiconductor memory; and a pre-amplifier located between the amplifier and the memory cell, where the pre-amplifier is configured to pre-amplify an electrical signal transmitted from the memory cell to the amplifier. In this way, the pre-amplifier is provided between the sense amplifier and the memory cell, such that the electrical signal stored in the semiconductor memory can be output after two stages of amplification by the pre-amplifier and the sense amplifier, thereby avoiding the problem that the electrical signal output from the memory cell cannot be accurately received and output in a case of a small sense margin of a signal of the sense amplifier.

BRIEF DESCRIPTION OF THE DRAWINGS

The accompanying drawings, which are incorporated into and constitute a part of this specification, illustrate the embodiments of the invention and together with this specification, serve to explain the principles of the invention.

Figure 1:
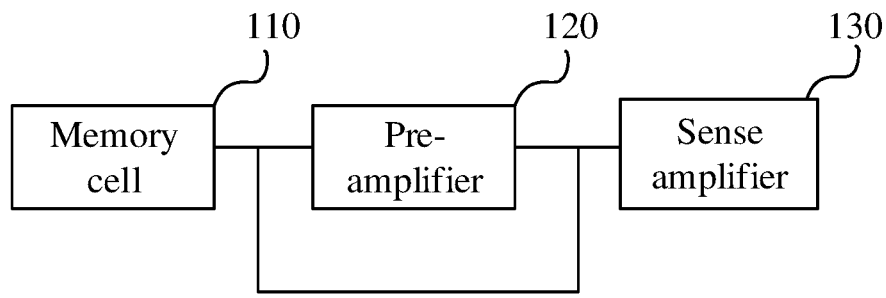
FIG. 1 is a schematic diagram of a structure of a sense amplifier circuit according to some embodiments of the invention.

Reference numerals: 110: memory cell; 111: capacitor; 112: switching transistor; 120: pre-amplifier; 121: first transistor; 122: second transistor; 130: sense amplifier; 200: semiconductor substrate; 210: first well; 220: second well; 230: bit line; 240: bit line lead-out region; 300: protrusion; 310: first sub-protrusion; 320: second sub-protrusion; 330: columnar structure; 401: first doped region; 402: second doped region; 403: third doped region; 404: fourth doped region; 501: first conductive plug; 502: second conductive plug; 503: third conductive plug; 504: fourth conductive plug; 505: fifth conductive plug; 601: first metal layer; 602: second metal layer; 603: third metal layer; and 700; dummy gate.

The accompanying drawings described above have shown specific embodiments of the invention, which will be described in more detail below. These accompanying drawings and written descriptions are not intended to limit the scope of the concept of the invention in any way, but to explain the concept of the invention to those skilled in the art by reference to specific embodiments.

DETAILED DESCRIPTION OF EMBODIMENTS

Herein, exemplary embodiments will be described in detail, and examples thereof are shown in the accompanying drawings. When the following description refers to the accompanying drawings, unless otherwise indicated, the same reference numerals in different drawings indicate the same or similar elements. Implementations described in the following exemplary embodiments do not represent all implementations in accordance with the invention. Instead, they are merely examples of an apparatus and a method in accordance with some aspects of the invention.

At present, miniaturization of semiconductor memories becomes a development trend for semiconductor devices. However, continuous downsizing of the semiconductor memories also produces some adverse effects, such as a reduced quantity of stored charge and an increased threshold voltage mismatch between transistors.

According to a sense amplifier circuit and a method for operating a sense amplifier circuit provided in the invention, which may take advantage of a feature that a bit line of a vertical memory structure (but not limited to the vertical memory structure) is a silicon-containing substrate, a pre-amplifier is fabricated in a bit line lead-out region, and pre-amplification is performed before the sense amplifier, so as to address an excessive mismatch of the sense amplifier and mitigate challenges to device fabrication in a device region, thereby alleviating these adverse effects. The technical solutions of the invention and how the technical solutions of the invention resolve the foregoing technical problems are described in detail below with specific embodiments. The following specific embodiments may be combined with each other, and the same or similar concepts or processes may not be repeated in some embodiments. Embodiments of the invention are described below with reference to the accompanying drawings.

FIG. 1 is a schematic diagram of a structure of a sense amplifier circuit according to some embodiments of the invention. As shown in FIG. 1, the sense amplifier circuit includes: an amplifier 130 electrically connected to a memory cell 110 of a semiconductor memory; and a pre-amplifier 120 located between the amplifier 130 and the memory cell 110, where the pre-amplifier 120 is configured to pre-amplify an electrical signal transmitted from the memory cell 110 to the amplifier 130.

For example, a semiconductor memory usually includes a plurality of memory cells 110 arranged in an array, where each memory cell 110 is configured to store its own data information. Moreover, the amplifier 130 in this embodiment is electrically connected to the memory cell 110 in the semiconductor memory. In addition, the pre-amplifier 120 is further connected between the amplifier 130 and the memory cell 110, that is, one terminal of the pre-amplifier 120 is connected to one terminal of the memory cell 110, and the other terminal of the pre-amplifier 120 is connected to one terminal of the amplifier 130. In addition, the one terminal of the amplifier 130 is further connected to the one terminal of the memory cell 110.

An electrical signal in the memory cell 110 may be pre-amplified by the pre-amplifier 120, and the pre-amplified signal is output to the amplifier 130, so that the electrical signal in the memory cell 110 is output after two stages of amplification.

To write data to the memory cell 110, an electrical signal to be written may be transmitted over an electrical connection line between the one terminal of the amplifier 130 and the one terminal of the memory cell 110.

In this embodiment, the pre-amplifier 120 is provided between the amplifier 130 and the memory cell 110, such that the electrical signal stored in the semiconductor memory can be output after two stages of amplification by the pre-amplifier 120 and the amplifier 130, thereby avoiding a sharp increase in a threshold voltage mismatch when the sense amplifier has an extremely small size in the case of scaling down the memory, as well as a significant decrease or even disappearance of a sense margin of the sense amplifier due to an increasingly small electrical signal stored in the case of scaling down the region of the memory cell 110.

In some embodiments, the amplifier 130 is electrically connected to a bit line corresponding to the memory cell 110 and a reference bit line, where the reference bit line may be a bit line adjacent to the bit line corresponding to the memory cell 110.

For example, the plurality of memory cells 110, such as a plurality of capacitors 111, are usually arranged in an array in the semiconductor memory. Each row of memory cells 110 is connected to the same word line, and each column of memory cells 110 is connected to the same bit line. A word line and a bit line may be configured to receive an external control signal, so that an electrical signal in a memory cell 110 at the intersection of the word line and the bit line can be output via the bit line corresponding to the memory cell 110. Specifically, each memory cell 110 in the semiconductor memory may correspond to one sense amplifier 130 or each column of memory cells 110 may correspond to one sense amplifier 130. In specific connection, the sense amplifier 130 may be connected to each of a bit line and a reference bit line of a memory cell 110 corresponding to the sense amplifier 130. In practical applications, the sense amplifier 130 can determine output data by comparing voltages on the bit line and the reference bit line connected to the sense amplifier 130.

In addition, on the basis of the above-mentioned connection of the sense amplifier 130, the one terminal of the pre-amplifier 120 is also connected to the memory cell 110 via the bit line corresponding to the memory cell 110, and the other terminal of the pre-amplifier 120 is also connected to the one terminal of the sense amplifier 130 via the bit line corresponding to the memory cell 110.

Figure 2:
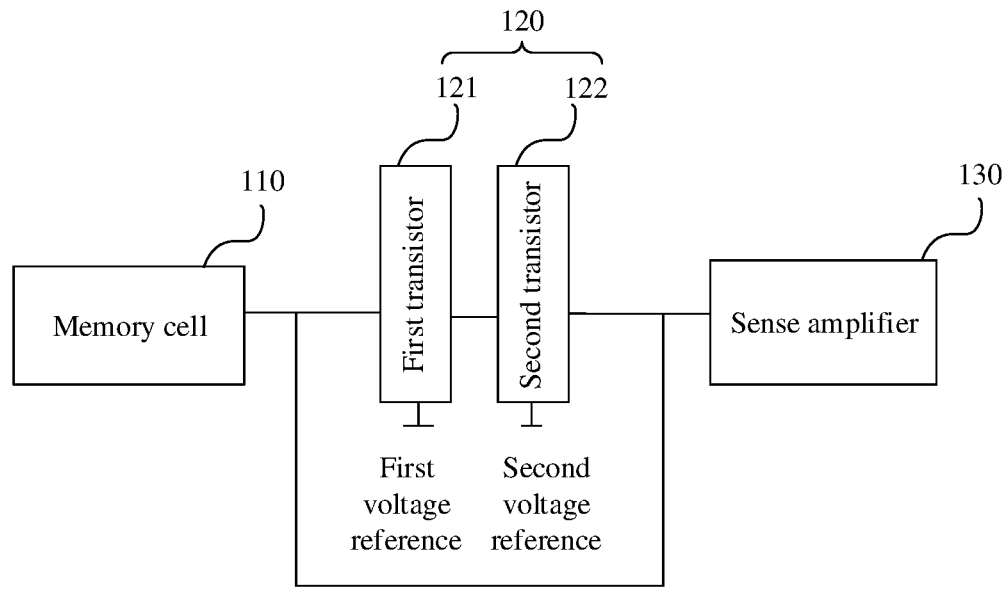
FIG. 2 is a schematic diagram of a structure of a second sense amplifier circuit according to some embodiments of the invention.

In a possible implementation of designing the pre-amplifier 120, the pre-amplifier 120 includes two transistors, namely a first transistor 121 and a second transistor 122. FIG. 2 is a schematic diagram of a structure of a second sense amplifier circuit according to some embodiments of the invention. A base of the first transistor 121 is electrically connected to the memory cell 110 corresponding to the pre-amplifier 120. An emitter of the first transistors 121 is connected to a first voltage reference. A base of the second transistor 122 is connected to a collector of the first transistor 121, an emitter of the second transistor 122 is connected to a second voltage reference, and a collector of the second transistor 122 is connected to the sense amplifier 130 corresponding to the pre-amplifier 120. To obtain an electrical signal stored in the memory cell 110, the first voltage reference and the second voltage reference (that is, a voltage of the emitter of the first transistor 121 and a voltage of the emitter of the second transistor 122) may be adjusted such that the first transistor 121 and the second transistor 122 can determine biased states of the first transistor 121 and the second transistor 122 based on electrical signals flowing into their respective bases and voltages of their respective emitters. When the electrical signal in the memory cell 110 enters the pre-amplifier 120, the electrical signal can be successively amplified by the first transistor 121 and the second transistor 122. At this time, a quantity of charge in the capacitor 111 in the memory cell 110 has been amplified twice to reach the bit line, and a significant voltage change will occur on the bit line. Therefore, when the amplified electrical signal enters the sense amplifier 130, a very large sense margin will be generated. The sense amplifier 130 outputs data stored in the memory cell 110 after comparative amplification.

Figure 3:
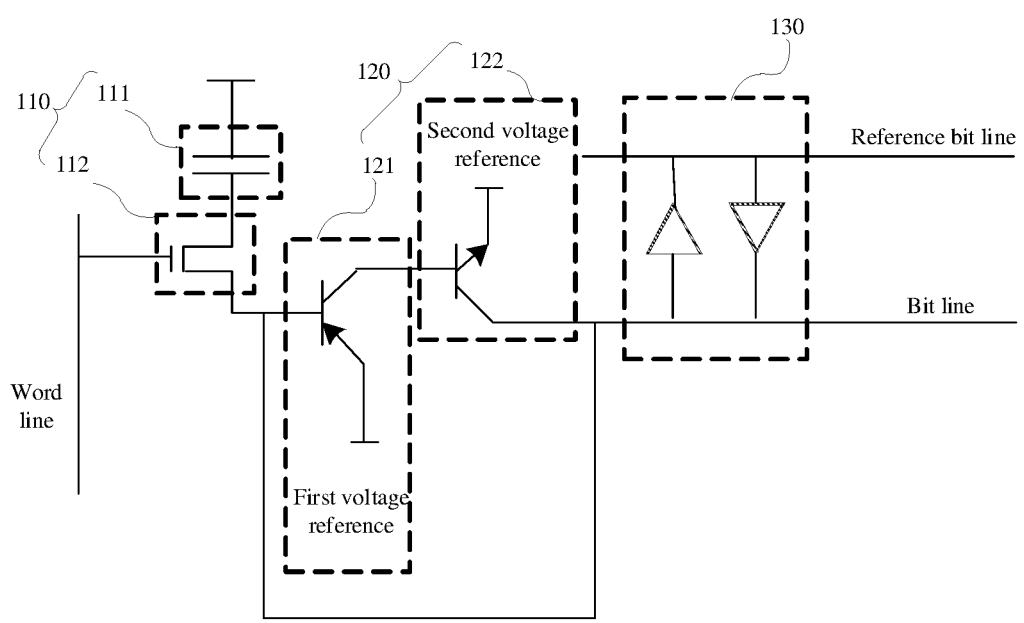
FIG. 3 is a schematic diagram of a structure of a third sense amplifier circuit according to some embodiments of the invention.

In addition, polarities of the first transistor 121 and the second transistor 122 in the pre-amplifier 120 are opposite. Specifically, for example, the first transistor 121 is a PNP transistor, and the second transistor 122 is an NPN transistor; or the first transistor 121 is an NPN transistor, and the second transistor 122 is a PNP transistor. Therefore, such a bipolar junction transistor as the first transistor 121 and/or the second transistor 122 amplifies unipolar charges. For example, FIG. 3 is a schematic diagram of a structure of a third sense amplifier circuit according to some embodiments of the invention. In the figure, a memory cell 110 includes a capacitor 111 and a switching transistor 112 (controlled by a signal input from a word line WL). A first transistor 121 of a pre-amplifier 120 is a PNP transistor, and a second transistor 122 thereof is an NPN transistor. In addition, one terminal of a sense amplifier 130 is connected to a bit line corresponding to the memory cell 110, and the other terminal thereof is connected to a reference bit line.

In a possible implementation, the pre-amplifier 120 may include an even number of transistors, and polarities of adjacent transistors are different. In other words, the number of transistors is not limited to 2, and may also be a larger even number of transistors, e.g., 4 or 6.

In addition, when the pre-amplifier 120 includes two transistors with different polarities, the pre-amplifier 120 can only amplify an electrical signal of a single polarity. For example, the pre-amplifier 120 can only amplify any one of an electrical signal of a positive polarity or an electrical signal of a negative polarity stored in the memory cell 110.

When the first transistor 121 of the pre-amplifier 120 is a PNP transistor, and the second transistor 122 thereof is an NPN transistor, the pre-amplifier 120 is configured only to amplify incoming negative charges. When an electrical signal prestored in the memory cell 110 is of a positive polarity, the first transistor 121 of the pre-amplifier 120 is in a reverse biased state, i.e., a non-conducting state, based on the first voltage reference and the electrical signal at the base of the first transistor 121.

When the first transistor 121 of the pre-amplifier 120 is an NPN transistor and the second transistor 122 thereof is a PNP transistor, the pre-amplifier 120 is configured only to amplify incoming positive charges. When an electrical signal prestored in the memory cell 110 is of a negative polarity, the first transistor 121 of the pre-amplifier 120 is in a reverse biased state, i.e., a non-conducting state, based on the first voltage reference and the electrical signal at the base of the first transistor 121.

In a possible implementation, to avoid that the pre-amplifier 120 can only amplify charges of a single polarity, a voltage difference between the bit line connected to the sense amplifier 130 and the reference bit line may be set. To be specific, when the pre-amplifier 120 can be used to amplify the electrical signal of the negative polarity, the voltage difference between the bit line connected to the sense amplifier 130 and the reference bit line may be set to a forward voltage difference, and thus when the electrical signal of the positive polarity cannot enter the pre-amplifier 120, the electrical signal can directly enter one terminal of the sense amplifier 130 via the bit line, so that the sense amplifier 130 can output data represented by the electrical signal of the positive polarity based on the preset forward voltage difference. When the electrical signal of the negative polarity is amplified by the pre-amplifier 120 and then output to the sense amplifier 130, the amplified signal can offset the preset forward voltage difference, that is, a voltage difference between the bit line connected to the sense amplifier 130 and the reference bit line changes from a forward voltage difference to a reverse voltage difference, so that the sense amplifier 130 outputs data corresponding to the electrical signal of the negative polarity based on the voltage difference.

In addition, if the pre-amplifier 120 can be used to amplify the electrical signal of the positive polarity, the voltage difference between the bit line connected to the sense amplifier 130 and the reference bit line may be set to a reverse voltage difference.

In this embodiment, the pre-amplifier 120 is used in addition to setting the voltage difference on the side of the sense amplifier 130, thereby avoiding the problem that the electrical signal output by the memory cell 110 cannot be accurately received and output when the sense margin of the sense amplifier 130 is small.

Figure 4:
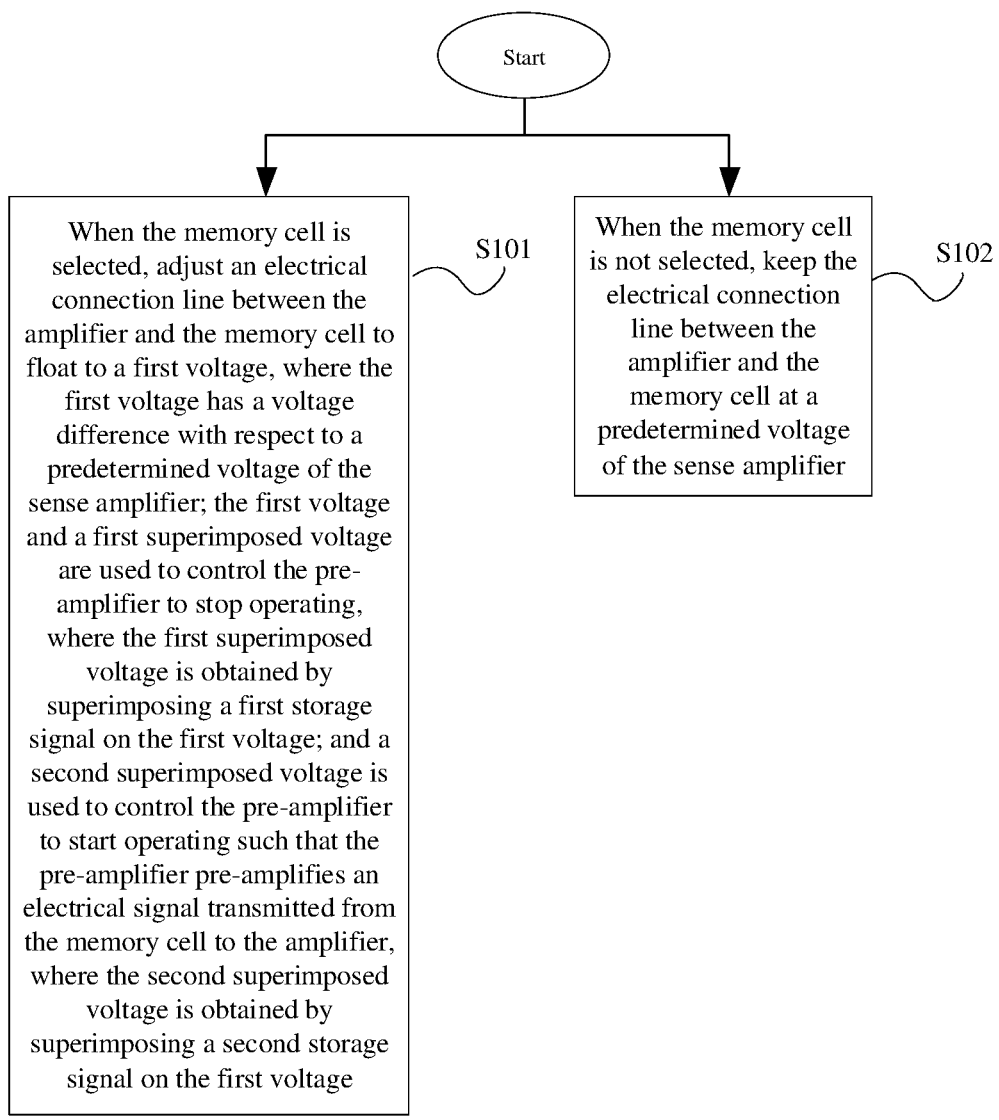
FIG. 4 is a schematic flowchart of a method for operating a sense amplifier circuit according to some embodiments of the invention.

FIG. 4 is a schematic flowchart of a method for operating a sense amplifier circuit according to some embodiments of the invention. The method is applied to the sense amplifier circuit as shown in FIG. 1. The method includes the following steps:

S101: When the memory cell is selected, adjust an electrical connection line between the sense amplifier and the memory cell to float to a first voltage, where the first voltage has a voltage difference with respect to a predetermined voltage of the sense amplifier; the first voltage and a first superimposed voltage are used to control the pre-amplifier to stop operating, where the first superimposed voltage is obtained by superimposing a first storage signal on the first voltage; and a second superimposed voltage is used to control the pre-amplifier to start operating such that the pre-amplifier pre-amplifies an electrical signal transmitted from the memory cell to the sense amplifier, where the second superimposed voltage is obtained by superimposing a second storage signal on the first voltage.

S102: When the memory cell is not selected, keep the electrical connection line between the sense amplifier and the memory cell at a predetermined voltage of the sense amplifier.

For example, based on the sense amplifier circuit shown in FIG. 2, if the pre-amplifier 120 in the sense amplifier circuit can be used to amplify an electrical signal of a single polarity, when data stored needs to be obtained from the memory cell 110 (i.e., when the memory cell 110 is selected), the electrical connection line between the sense amplifier 130 and the memory cell 110 needs to be adjusted to float to the first voltage such that there is a voltage difference between the connection line and the predetermined voltage of the sense amplifier 130. In this embodiment, the electrical signal stored in the memory cell 110 may be either the first storage signal or the second storage signal, where the first storage signal and the second storage signal are signals of different polarities. In addition, the operation of the pre-amplifier 120 is in a stopped state under the action of the first voltage, and even under the action of the first storage signal stored in the memory cell 110 and the superimposed signal of the first voltage signal, the operation of the pre-amplifier 120 is still in the stopped state, and the first storage signal stored in the memory cell 110 cannot enter the pre-amplifier 120. If the signal stored in the memory cell 110 is the second storage signal, the pre-amplifier 120 starts operating under the action of the second superimposed voltage obtained by superimposing a second storage signal on the first voltage. At this time, the second storage signal stored in the memory cell 110 can pass through and enter the pre-amplifier 120 such that the pre-amplifier 120 pre-amplifies the electrical signal transmitted from the memory cell 110 to the sense amplifier 130.

The control process during the actual operation of the above sense amplifier circuit is as follows: When it is determined to read from the memory cell 110, a voltage potential of the connection line between the memory cell 110 and the sense amplifier 130 is first floated to the first voltage such that there is a voltage difference between the connection line and the sense amplifier 130, and at this time, a voltage at the connection between the pre-amplifier 120 and the sense amplifier 130 is also floated to the first voltage. Then, a storage signal in the memory cell 110 flows out by controlling the word line of the memory cell 110. When the storage signal flows to one terminal of the pre-amplifier 120, if the storage signal is the first storage signal, the pre-amplifier 120 stops operating, and there is a voltage difference between the electrical connection line and the predetermined voltage of the sense amplifier 130, such that the sense amplifier 130 outputs data corresponding to the storage signal. If the storage signal is the second storage signal, the pre-amplifier 120 starts operating, amplifies the storage signal, and transmits the amplified signal to the sense amplifier 130. The amplified signal can offset the voltage difference between the electrical connection line of the sense amplifier 130 and the predetermined voltage, and the sign of the original voltage difference is changed such that the sense amplifier 130 outputs the data stored in the memory cell 110 based on the changed voltage difference.

In addition, to write back a signal to the memory cell 110, the signal to be stored can be input to the memory cell 110 over the electrical connection line between the sense amplifier 130 and the memory cell 110 when the word line is gated.

When the memory cell 110 is not selected, that is, neither reading nor writing is performed (for example, in a pre-charging phase before reading data or in a pre-charging phase before writing data), the voltage of the electrical connection line between the memory cell 110 and the sense amplifier 130 is kept at the predetermined voltage of the sense amplifier 130.

In this embodiment, during the process of controlling the voltage on the electrical connection line between the sense amplifier 130 and the memory cell 110 based on whether the memory cell 110 is selected, so as to read the electrical signal stored in the memory cell 110, if amplification by the pre-amplifier 120 is impossible, the sense amplifier 130 can directly and accurately output the stored electrical signal based on the voltage difference on the side of the sense amplifier 130.

In a possible implementation, in an actual circuit, the electrical connection line between the sense amplifier 130 and the memory cell 110 is the bit line corresponding to the memory cell 110, and the sense amplifier 130 is also connected to the reference bit line of the bit line.

In this case, in the foregoing embodiment, the electrical connection line between the sense amplifier 130 and the memory cell 110 is adjusted to float to the first voltage, that is, a bit line voltage of the bit line of the memory cell 110 to which the sense amplifier 130 is electrically connected is adjusted to float to the first voltage, and the predetermined voltage of the sense amplifier 130 is the predetermined voltage on the reference bit line connected to the sense amplifier 130.

In a possible implementation, the plurality of pre-amplifiers 120 in the sense amplifier circuit includes: first transistors 121, where bases of the first transistors 121 are connected to the plurality of memory cells 110, and emitters of the first transistors 121 are connected to a first voltage reference; and second transistors 122, where bases of the second transistors 122 are connected to collectors of the first transistors 121, emitters of the second transistors 122 are connected to a second voltage reference, and collectors of the second transistors 122 are connected to the plurality of sense amplifiers 130.

Specifically, adjusting the electrical connection line between the sense amplifier 130 and the memory cell 110 to float to the first voltage (i.e., when step S101 is performed) may specifically include the following two phases.

Figure 5:
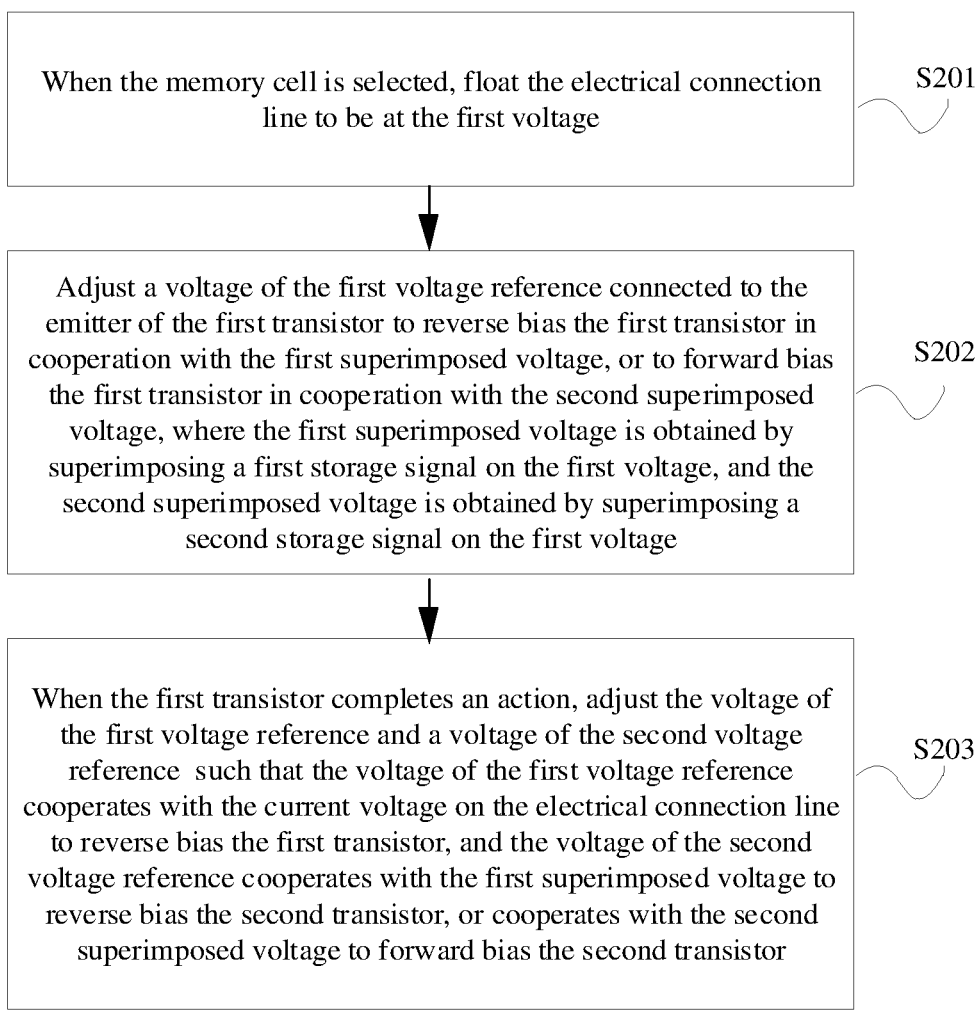
FIG. 5 is a schematic flowchart of a second method for operating a sense amplifier circuit according to some embodiments of the invention.

A control process in the reading phase is as shown in FIG. 5. FIG. 5 is a schematic flowchart of a second method for operating a sense amplifier circuit according to some embodiments of the invention. Specifically, the process includes the following steps:

S201: When the memory cell is selected, float the electrical connection line to be at the first voltage.

S202: Adjust a voltage of the first voltage reference connected to the emitter of the first transistor to reverse bias the first transistor in cooperation with the first superimposed voltage, or to forward bias the first transistor in cooperation with the second superimposed voltage, where the first superimposed voltage is obtained by superimposing a first storage signal on the first voltage, and the second superimposed voltage is obtained by superimposing a second storage signal on the first voltage.

S203: When the first transistor completes an action (amplification or cutoff), adjust the voltage of the first voltage reference and a voltage of the second voltage reference such that the voltage of the first voltage reference cooperates with the current voltage on the electrical connection line to reverse bias the first transistor, and the voltage of the second voltage reference cooperates with the first superimposed voltage to reverse bias the second transistor, or cooperates with the second superimposed voltage to forward bias the second transistor.

For example, when the pre-amplifier 120 includes the first transistor 121 and the second transistor 122, if data stored in the memory cell 110 needs to be read, the electrical connection line between the sense amplifier 130 and the memory cell 110 first needs to be floated to the first voltage, and the voltage of the first voltage reference connected to the emitter of the first transistor 121 needs to be adjusted such that the emitter of the first transistor 121 is at the current voltage of the first voltage reference. If the voltage of the base of the first transistor 121 is the first voltage or the first superimposed voltage, the first transistor 121 is in an off state (i.e., reverse biased state). If the voltage of the base of the first transistor 121 is the second superimposed voltage, the second superimposed voltage is less than the voltage of the first voltage reference such that the first transistor 121 is switched on (i.e., in a forward biased state). In some examples, when step S202 is performed, the voltage of the second voltage reference connected to the emitter of the second transistor is also adjusted such that voltage potentials of the first voltage reference and the second voltage reference after the adjustment are the same, thereby avoiding latch-up effect.

After the first transistor 121 completes the action (amplification or cutoff), the amplification action of the first transistor 121 is the action of amplifying the electrical signal transmitted to the first transistor 121 when the first transistor 121 is in the forward biased state, and the cutoff action of the first transistor 121 is that the first transistor 121 is in the reverse biased state after being adjusted in step S202. The voltage of the first voltage reference at the emitter of the first transistor 121 and the voltage of the second voltage reference at the emitter of the second transistor 122 are adjusted again such that the first transistor 121 is reverse biased under the action of the current voltage of the first voltage reference. The state of the second transistor 122 has two cases: In one case, when a signal at the base of the second transistor 122 is a signal amplified and output by switching on the first transistor 121, the second transistor 121 is in an on state based on the amplified and output signal and the current voltage of the second voltage reference, such that the second transistor 122 continues to amplify and output a signal input from its base. In the other case, when the voltage at the base of the second transistor 122 maintains its initial voltage when the first transistor 121 is cut off, the second transistor 122 is cut off under the action of the current voltage of the second voltage reference, without changing the voltage on the electrical connection line connected to the emitter of the second transistor 122.

To be specific, when the data stored in the memory cell 110 needs to be read, the voltage on the electrical connection line between the memory cell 110 and the sense amplifier 130 first needs to be adjusted to float to the first voltage such that there is a voltage difference at the sense amplifier 130. Then, the word line is gated such that the signal stored in the memory cell 110 can flow out, and the voltages at respective emitters of the first transistor 121 and the second transistor 122 are adjusted such that a signal of one polarity stored in the memory cell 110 flows from the pre-amplifier 120 including the first transistor 121 and the second transistor 122 into the sense amplifier 130. A signal of the other polarity stored in the memory cell 110 cannot enter the pre-amplifier 120 including the first transistor 121 and the second transistor 122.

In a writing phase, when a column in which the sense amplifier 130 is located is selected, the voltage of the first voltage reference is adjusted to reverse bias the first transistor 121 in cooperation with a writing signal on the electrical connection line.

For example, after the data in the memory cell 110 is read out, the data needs to be written into the memory cell 110 again. When the column in which the sense amplifier 130 is located is selected (that is, the data needs to be written into the memory cell 110 corresponding to the sense amplifier 130), the sense amplifier 130 is in an on state, and the word line corresponding to the memory cell 110 to which the data is to be written is still in a gated state. In this case, the voltage of the first voltage reference at the emitter of the first transistor 121 in the sense amplifier circuit is adjusted such that it possible to write the data to be written into the memory cell 110 again over the electrical connection line between the sense amplifier 130 and the memory cell 110. In addition, in the process of writing the data, the first transistor 121 is in the reverse biased state based on a voltage of a signal corresponding to the written data and the voltage at the emitter of the first transistor 121, so as to ensure that when the data is written into the memory cell 110, the signal written at this time is does not enter the pre-amplifier 120.

In this embodiment, when the pre-amplifier 120 includes two transistors, it is further required to control voltages at the respective emitters of the first transistor 121 and the second transistor 122 in the phase of reading from the memory cell 110, so that the transistors can be switched on or off based on voltages of signals at their respective bases and emitters.

In some examples, the first transistor 121 is a PNP transistor, and the second transistor 122 is an NPN transistor, where there is a forward voltage difference with respect to the predetermined voltage. Alternatively, the first transistor 121 is an NPN transistor, and the second transistor 122 is a PNP transistor, where there is a reverse voltage difference with respect to the predetermined voltage.

For example, in the following description, the first transistor 121 is a PNP transistor, and the second transistor 122 is an NPN transistor. In this case, the pre-amplifier 120 including the first transistor 121 and the second transistor 122 can be used to amplify an electrical signal of the negative polarity. In addition, in this case, the voltage difference between the sense amplifier 130 and the predetermined voltage may be adjusted to be a forward voltage difference. If the electrical signal stored in the memory cell 110 is the electrical signal of the negative polarity, the electrical signal of the negative polarity may be amplified and output by the pre-amplifier 120 to the sense amplifier 130. Since there is the forward voltage difference on the side of the sense amplifier 130 in advance, that is, the first voltage on the connection line between the sense amplifier 130 and the memory cell 110 is higher than the predetermined voltage of the sense amplifier 130, when the amplified electrical signal of the negative polarity enters the sense amplifier 130, the amplified electrical signal of the negative polarity pulls down the voltage value of the first voltage on the connection line between the sense amplifier 130 and the memory cell 110, and makes a voltage value of the pull-down first voltage less than the predetermined voltage of the sense amplifier 130, such that data corresponding to the electrical signal of the negative polarity is output under the action of the sense amplifier 130. If the signal prestored in the memory cell 110 is a signal of the positive polarity, since the first transistor 121 in the pre-amplifier 120 cannot be switched on based on the electrical signal of the positive polarity and the voltage of the first voltage reference at the emitter of the first transistor 121, and the forward voltage difference is set on the sense amplifier 130, even if the electrical signal of the positive polarity in the memory cell 110 is not amplified and the signal value is small, the sense amplifier 130 can output data corresponding to the electrical signal of the positive polarity based on the set forward voltage difference.

Specifically, a specific example is used to describe the process of operating the sensor amplifier circuit when the first transistor 121 is a PNP transistor and the second transistor 122 is an NPN transistor. It is assumed that a high storage voltage potential corresponding to the memory cell 110 is 1 V, and a low storage voltage potential is 0 V. Table 1 shows changes in a voltage status of the sense amplifier circuit when reading a storage signal in the memory cell 110 of the sense amplifier circuit, which is an electrical signal of a negative polarity.

TABLE 1

Voltage status of the sense amplifier circuit when reading the electrical signal of the negative polarity

| Phase | Lower plate of capacitor | First voltage reference | Second voltage reference | Base of second transistor | Bit line | First transistor | Second transistor | Word line |
|---|---|---|---|---|---|---|---|---|
| 1 | 0 V | 0.7 V | 0.7 V | 0 V (floating) | 0.7 V | Off | Off | −0.7 V |
| 2 | >0 V | 0.7 V | 0.7 V | >0 V (floating) | ≤0.7 V (floating) | On | Off | 2.9 V |
| 3 | >0 V | 0 V | 0 V | >0 V (floating) | ≥0 V (floating) | Off | On | 2.9 V |
| 4 | 0 V | 0 V | 0 V | 0 V (floating) | 0 V | Off | Off | 2.9 V |

In Table 1, the process of reading the signal is divided into four phases: phase 1 to phase 4. The lower plate of the capacitor in the table represents a voltage on the lower plate (i.e., a plate connected to the switching transistor 112) of the capacitor 111 in the memory cell 110. On/Off indicates that the transistor is switched on/off, respectively. In this embodiment, when a voltage signal of 0 V is stored in the lower plate of the capacitor, a signal stored in the memory cell 110 is the electrical signal of the negative polarity.

When it is determined that the storage signal needs to be read from the memory cell 110, first, in phase 1, the voltage on the bit line (i.e., an electrical connection line connected to the memory cell 110 and the sense amplifier 130) corresponding to the memory cell 110 is set to the first voltage of 0.7 V, and the predetermined voltage of the sense amplifier 130 is set to 0.5 V. In addition, the first voltage reference at the emitter of the first transistor 121 is set to 0.7 V and the second voltage reference at the emitter of the second transistor 122 is set to 0.7 V. The voltage potential of the word line is kept at −0.7 V such that the switching transistor 112 connected to the word line is switched off. It should be noted that in this case, the voltage of the base of the second transistor 122 is floating around 0 V (floating in the table is used to represent floating, and because an initial state of the emitter of the second transistor is 0 V, the voltage of the base of the second transistor 122 is pulled to 0 V), such that the second transistor is in the reverse biased state. Because voltage potentials of the bit line and the emitter of the first transistor are the same, the first transistor is also in the reverse biased state.

In phase 2, a bias voltage on the bit line is disconnected such that the voltage on the bit line becomes floating, i.e., floating to 0.7 V. The voltage of the word line is set to 2.9 V such that the switching transistor 112 connected to the word line is switched on, and the electrical signal of the negative polarity on the capacitor 111 enters the bit line, causing the voltage potential of the bit line to drop to less than 0.7 V. The first transistor is made in the forward biased state (i.e., an on state) based on the voltage at its emitter and the voltage flowing into the base of the first transistor 121. After the first transistor is switched on, the current flows from the emitter of the first transistor, one part of which neutralizes the electrical signal of the negative polarity received at the base of the first transistor to increase the voltage of the lower plate of the capacitor, and the other part is amplified by the first transistor 121, and an amplified signal is output from the collector of the first transistor 121, where a charge polarity of the amplified signal is opposite to that of charge input at the base of the first transistor 121. The amplified signal enters the base of the second transistor, such that the voltage at the base of the second transistor rises, but because the emitter voltage of the second transistor is 0.7 V at this time, the second transistor is still in the reverse biased state (that is, an off state).

In phase 3, the first voltage reference at the emitter of the first transistor 121 is set to 0 V, and the second voltage reference at the emitter of the second transistor 122 is set to 0 V. At this time, the first transistor 121 changes from the forward biased state to the reverse biased state based on the adjustment of the voltage of the emitter of the first transistor 121. The second transistor 122 changes from the reverse biased state to the forward biased state because the voltage at the base of the second transistor 122 is greater than the adjusted voltage at the emitter of the second transistor 122. In addition, since the second transistor 122 is switched on and the voltage at the emitter of the second transistor 122 is 0 V, the voltage on the bit line connected to the collector of the second transistor 122 drops due to the conduction of the second transistor 122. Similarly, since the bit line is connected to the base of the first transistor 121, and the base of the first transistor 121 is connected to the lower plate of the capacitor 111 via the switching transistor 112, the voltage of the lower plate is also pulled down.

In phase 4, the sense amplifier 130 starts operating. By comparing the bit line with the predetermined voltage of the sense amplifier 130, the voltage on the bit line is pulled down to 0 V, and at the same time, the voltage on the lower plate of the capacitor 111 in the memory cell 110 connected to the bit line via the switching transistor 112 is also pulled down to 0 V.

Table 2 shows changes in a voltage status of the sense amplifier circuit when reading a storage signal in the memory cell 110 of the sense amplifier circuit, which is an electrical signal of a positive polarity. When the electrical signal to be read is the electrical signal of the positive polarity, it is assumed that the voltage on the lower plate of the capacitor 111 is 1 V.

TABLE 2

| | Voltage status of the sense amplifier circuit when reading the electrical signal of the positive polarity | | | | | | | |
|---|---|---|---|---|---|---|---|---|
| Phase | Lower plate of capacitor | First voltage reference | Second voltage reference | Base of second transistor | Bit line | First transistor | Second transistor | Word line |
| 1 | 1 V | 0.7 V | 0.7 V | 0 V (floating) | 0.7 V | Off | Off | −0.7 V |
| 2 | ≥0.7 V | 0.7 V | 0.7 V | 0 V (floating) | ≥0.7 V (floating) | Off | Off | 2.9 V |
| 3 | ≥0.7 V | 0 V | 0 V | 0 V (floating) | ≥0.7 V (floating) | Off | Off | 2.9 V |
| 4 | 1 V | 0 V | 0 V | 0 V (floating) | 1 V | Off | Off | 2.9 V |

Phase 1 in Table 2 is the same as the process of the voltage status in the sense amplifier circuit when reading the electrical signal of the negative polarity, and details will not be repeated herein.

In phase 2, a bias voltage on the bit line is disconnected such that the voltage on the bit line becomes floating, i.e., floating to 0.7 V. The voltage of the word line is set to 2.9 V such that the switching transistor 112 connected to the word line is switched on, and then the electrical signal of the positive polarity on the capacitor 111 enters the bit line, causing the voltage of the bit line to rise to greater than 0.7 V. The first transistor 121 is in the reverse biased state based on the voltage at its emitter and the voltage flowing into the base of the first transistor 121. The voltage of the base of the second transistor 122 is floating around 0 V, and the second transistor 122 is in the reverse biased state.

In phase 3, the first voltage reference at the emitter of the first transistor 121 is set to 0 V, and the second voltage reference at the emitter of the second transistor 122 is set to 0 V. At this time, the first transistor 121 and the second transistor 122 are still in the reverse biased state.

In phase 4, the sense amplifier 130 starts operating. By comparing the bit line with the predetermined voltage of the sense amplifier 130, the voltage on the bit line is pulled up to 1 V.

During writing data to the memory cell 110, Table 3 shows changes in a voltage status of the sense amplifier circuit when writing data.

TABLE 3

| Phase | Lower plate of capacitor | First voltage reference | Second voltage reference | Base of second transistor | Bit line | First transistor | Second transistor | Word line |
|---|---|---|---|---|---|---|---|---|
| Writing | 0/1 V | 0 V | 0 V | 0 V (floating) | 0/1 V | Off | Off | 2.9 V |

Changes in the voltage status of the sense amplifier circuit when writing data

Specifically, when writing data, the first voltage reference at the emitter of the first transistor 121 needs to be adjusted to 0 V, such that when the memory cell 110 writes data via the sense amplifier 130, the first transistor 121 is always in the reverse biased state based on the written data and the current voltage (0 V) of the first voltage reference. Similarly, the voltage at the emitter of the second transistor 122 may be set to 0 V such that the second transistor 122 is in the reverse biased state. In addition, the sense amplifier 130 is controlled to be in an on state, and the voltage on the word line is adjusted such that the switching transistor 112 controlled by the word line is switched on. If the electrical signal stored in the memory cell 110 is charges of the positive polarity, the voltage on the electrical connection line between the sense amplifier 130 and the memory cell 110, that is, the bit line voltage, may be set to 1 V. If the electrical signal is charges of the negative polarity, the voltage on the electrical connection line may be set to 0 V, such that the sense amplifier 130 writes data to the memory cell 110 based on the voltage on the bit line and the predetermined voltage.

Moreover, when the memory cell 110 is not selected, that is, when the memory cell 110 is not selected via the word line and the bit line during reading or writing, a pre-charging operation may be performed on the bit line in which the memory cell 110 is located. Specifically, in the pre-charging phase, changes in a voltage status of the sense amplifier circuit are as shown in Table 4.

TABLE 4

| Phase | Lower plate of capacitor | First voltage reference | Second voltage reference | Base of second transistor | Bit line | First transistor | Second transistor | Word line |
|---|---|---|---|---|---|---|---|---|
| Pre-charging | 0/1 V | 0 V | 0 V | 0 V (floating) | 0.5 V | Off | Off | −0.7 V |

Changes in the voltage of the sense amplifier circuit in the pre-charging phase

As shown in Table 4, regardless of whether the voltage of the lower plate of the capacitor 111 in the memory cell 110 is 0 V/1 V, that is, regardless of the polarity of the storage signal in the memory cell 110, the first voltage reference at the emitter of the first transistor 121 and the second voltage reference at the emitter of the second transistor 122 are set to 0 V, and the first transistor 121 is in the reverse biased state. In addition, the predetermined voltage of the sense amplifier 130 is controlled to be the same voltage value of 0.5 V as the voltage on the bit line. In this phase, the voltage of the base of the second transistor 122 may be 0 V or greater than 0 V, but will be pulled to 0 V by the emitter of the second transistor 122, such that the second transistor 122 is in the reverse biased state.

In a possible implementation, in the foregoing method for controlling the sense amplifier circuit, voltage potentials of the first voltage reference and the second voltage reference may further be set to be equal at a same time, that is, the voltage of the emitter of the first transistor 121 is equal to the voltage of the emitter of the second transistor 122, thereby avoiding failure of the pre-amplifier 120 due to latch-up effect when the first transistor 121 and the second transistor 122 with different polarities are both switched on.

In a possible implementation, when the memory cell 110 and the sense amplifier 130 are connected together via the bit line of the column in which the memory cell 110 is located, the memory cell 110 may include: a capacitor 111 and a switching transistor 112, where one terminal of the capacitor 111 is connected to a second voltage, the other terminal of the capacitor 111 is connected to one terminal of the switching transistor 112, a control terminal of the switching transistor 112 is connected to a word line corresponding to the memory cell 110, and the other terminal of the switching transistor 112 is connected to a sense amplifier 130 and a pre-amplifier 120 corresponding to a column in which the memory cell 110 is located via a bit line corresponding to the column (for details, reference may be made to the schematic structural diagram shown in FIG. 3).

Moreover, on the basis of any of the methods for operating the sense amplifier circuit described above, in this embodiment, the magnitude of the second voltage connected to one terminal of the capacitor 111 is further controlled. In the related art, a quantity of charge in the capacitor 111 of the memory cell 110 is the product of a value of the capacitor 111 and a value of a voltage between two plates. In the design of the voltage difference between the two plates of the capacitor 111 in the memory, one plate of the capacitor 111 is set to, for example, 0.5 V, and the other plate of the capacitor 111 is set to, for example, 0 V or 1 V, thereby changing the quantity of charge 111 in the memory cell 110. The size of the positive charge and the negative charge stored in the capacitor 111 are the same, and only the polarities are different. In this embodiment, when the first voltage has a forward voltage difference with respect to the predetermined voltage, that is, when the first transistor 121 is a PNP transistor and the second transistor 122 is an NPN transistor, the second voltage of one terminal of the capacitor 111 is controlled to be greater than an average value of potentials corresponding to a first signal of the capacitor 111 and a second signal of the capacitor 111. For example, when the voltage on the other plate of the capacitor 111 is 0 V or 1 V, the second voltage on the other plate of the capacitor 111 is set to a value greater than 0.5 V. When the other terminal of the capacitor 111 is 0 V, a quantity of negative charge carried is a quantity of charge corresponding to the voltage difference of 0.7 V. When the other terminal of the capacitor 111 is 1 V, a quantity of positive charge carried is a quantity of charge corresponding to the voltage difference of 0.3 V. Through the control of the second voltage of the capacitor 111, the quantity of charge when the memory cell 110 stores the signal of the negative polarity is increased. Because the pre-amplifier 120 including the first transistor 121 and the second transistor 122 can be used to amplify the electrical signal of the negative polarity, the magnitude of the signal of the negative polarity is increased in advance through the control of the second voltage, thereby improving the sense margin of the pre-amplifier 120.

In addition, when the first voltage has a reverse voltage difference with respect to the predetermined voltage, that is, when the first transistor 121 is an NPN transistor, and the second transistor 122 is a PNP transistor, the second voltage is controlled to be less than the average value of the potentials corresponding to the first signal of the capacitor 111 and the second signal of the capacitor 111. Thus, through the control of the magnitude of the second voltage, a quantity of charge when the memory cell 110 stores the electrical signal of the positive polarity is increased. Because the pre-amplifier 120 including the first transistor 121 and the second transistor 122 can be used to amplify the electrical signal of the positive polarity, the magnitude of the signal of the positive polarity is increased in advance through the control of the second voltage, thereby improving the sense margin of the pre-amplifier 120.

Figure 6:
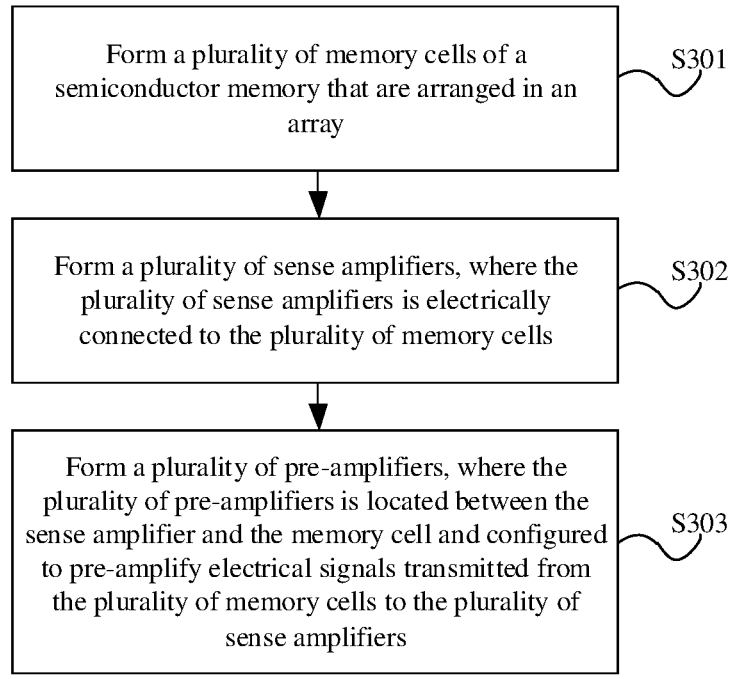
FIG. 6 is a schematic flowchart of a fabrication method for a sense amplifier circuit according to some embodiments of the invention.

FIG. 6 is a schematic flowchart of a fabrication method for a sense amplifier circuit according to some embodiments of the invention. The method includes the following steps:

S301: Form a plurality of memory cells of a semiconductor memory arranged in an array.

S302: Form a plurality of sense amplifiers, where the plurality of sense amplifiers is electrically connected to the plurality of memory cells.

S303: Form a plurality of pre-amplifiers, where the plurality of pre-amplifiers are located between the sense amplifier and the memory cell and configured to pre-amplify electrical signals transmitted from the plurality of memory cells to the plurality of sense amplifiers.

For example, in this embodiment, during the fabrication of the sense amplifier circuit, a plurality of memory cells 110 of a semiconductor memory arranged in an array are first formed on a pre-selected substrate. Then, a plurality of sense amplifiers 130 is formed, and the plurality of sense amplifiers 130 is electrically connected to the plurality of memory cells 110. In the design of the plurality of sense amplifiers 130, one sense amplifier 130 may be correspondingly provided for memory cells 110 in each column, that is, the memory cells 110 in each column are a one-to-one correspondence with the plurality of sense amplifiers 130. In some examples, the plurality of sense amplifiers 130 and the plurality of memory cells 110 are connected via a bit line 230 corresponding to a column in which the plurality of memory cells 110 are located.

After the plurality of sense amplifiers 130 is formed, a plurality of pre-amplifiers 120 is formed, and the plurality of pre-amplifiers 120 is located between the sense amplifier 130 and the memory cell 110 and may be configured to pre-amplify electrical signals transmitted from the plurality memory cells 110 to the plurality of sense amplifiers 130.

In a possible implementation, forming the plurality of memory cells 110 of the semiconductor memory arranged in the array, that is, step S301, is specifically implemented by using the following steps: (1) forming a plurality of bit lines and a plurality of bit line lead-out regions corresponding to the plurality of bit lines, with the plurality of bit lines and the plurality of bit line lead-out regions extending along a first direction, and the plurality of bit lines connected to respective columns of the plurality of memory cells; and (2) forming, on the plurality of bit lines, the plurality of memory cells arranged in the array.

For example, to form the plurality of memory cells 110, a plurality of bit lines 230 and a plurality of bit line lead-out regions 240 corresponding to the plurality of bit lines 230 are formed on a semiconductor substrate 200, and then the plurality of memory cells 110 arranged in the array are respectively formed on the plurality of bit lines 230.

In an example, when the plurality of bit lines 230 and the plurality of bit line lead-out regions 240 are formed, lines may be etched along a direction of the bit line 230 on the semiconductor substrate 200. An etching depth may range from 1500 A to 5000 A, e.g., 2000 A or 3000 A. Etched lines are disconnected from the middle, thereby forming a plurality of bit lines 230 and a plurality of bit line lead-out regions corresponding to the plurality of bit lines 230.

Moreover, on the basis of the foregoing steps, the plurality of pre-amplifiers 120 is formed on the bit line lead-out regions 240 corresponding to the plurality of bit lines 230, and the bit line lead-out regions 240 are in one-to-one correspondence with the pre-amplifiers 120. Input terminals of the plurality of pre-amplifiers 120 are respectively connected to bit lines 230 in a corresponding column of the memory cells 110 and output terminals of the plurality of pre-amplifiers 120, and the output terminals of the plurality of pre-amplifiers 120 are connected to the bit lines 230. In addition, the plurality of bit lines 230 in the semiconductor memory are connected to one terminals of the plurality of sense amplifiers 130 corresponding to the memory cells 110 in the columns, and the other terminals of the plurality of sense amplifiers 130 are connected to a reference bit line 230 of the plurality of bit lines 230.

In a possible implementation, the plurality of pre-amplifiers 120 includes first transistors 121 and second transistors 122, and forming the plurality of pre-amplifiers 120 on the plurality of bit line lead-out regions 240 specifically includes: forming the plurality of pre-amplifiers 120 including first transistors 121 and second transistors 122 on the plurality of bit line lead-out regions 240, where bases of the first transistors 121 are connected to the plurality of memory cells 110. Specifically, the bases of the first transistors 121 may be connected to the memory cells 110 via the bit lines 230 in a corresponding column of the memory cells 110 as the input terminals of the pre-amplifiers 120. Emitters of the first transistors 121 are connected to a first voltage reference. Bases of the second transistors 122 are connected to collectors of the first transistors 121, emitters of the second transistors 122 are connected to a second voltage reference, and collectors of the second transistors 122 are connected to the plurality of sense amplifiers 130. Specifically, the collectors of the second transistors 122 may be connected to the sense amplifiers 130 via the bit lines 230 as the output terminals of the pre-amplifiers 120.

In some embodiments, on the basis of the foregoing implementation, the plurality of pre-amplifiers 120 provided in this embodiment is formed based on buried bit lines 230. Therefore, forming the plurality of bit lines 230 and the plurality of bit line lead-out regions 240 corresponding to the plurality of bit lines 230 may specifically include the following steps: forming a first well 210 having a first conductivity type and a second well 220 having a second conductivity type on a semiconductor substrate 200 of a first conductivity type; and forming the plurality of bit lines 230 on the first well 210, and forming the bit line lead-out regions 240 on the second well 220.

Figure 7A:
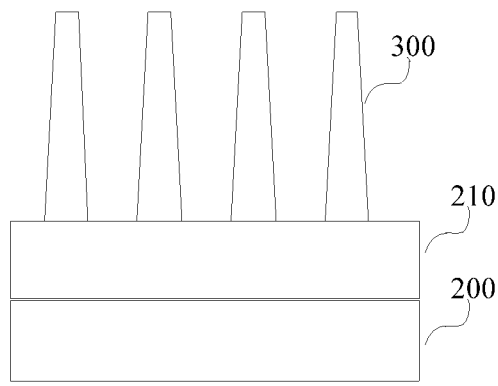
FIG. 7A is a schematic sectional view of a first well after etching according to some embodiments of the invention.
Figure 7B:
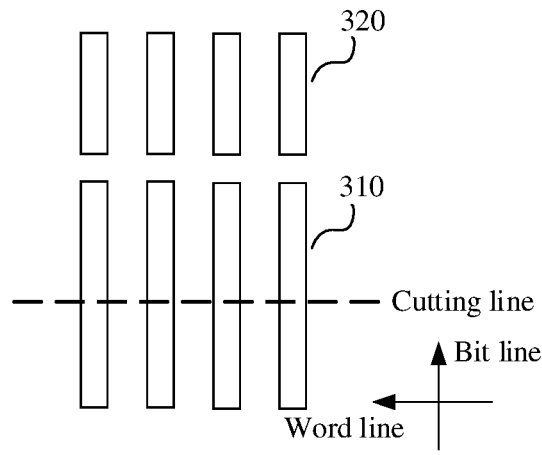
FIG. 7B is a top view of the first well after etching according to some embodiments of the invention.
Figure 8A:
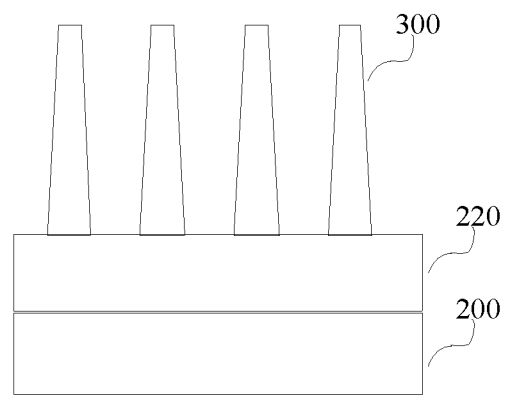
FIG. 8A is a schematic sectional view of a second well after etching according to some embodiments of the invention.
Figure 8B:
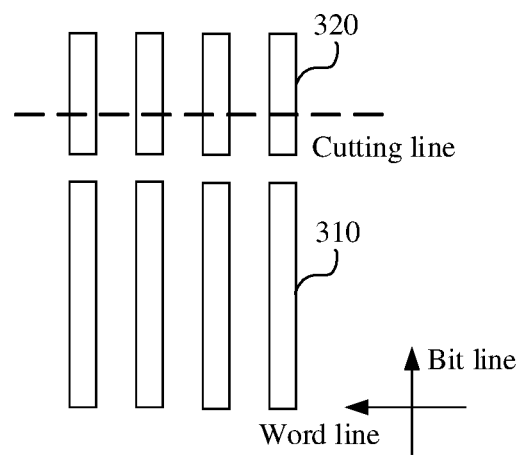
FIG. 8B is a top view of the second well after etching according to some embodiments of the invention.

For example, in this embodiment, to form the plurality of bit lines 230 and the plurality of bit line lead-out regions 240, two wells having different conductivity types may first be formed by doping on the pre-selected semiconductor substrate 200 of the first conductivity type, and bit lines 230 and bit line lead-out regions 240 are formed on different wells. The semiconductor substrate 200 may be made of a semiconductor material of silicon or silicon carbon compound. Further, the semiconductor substrate 200 is made of a semiconductor material of silicon, such that the first well 210 can be formed on a silicon substrate and connected to the second well 220 via lines at lead-out terminals of the silicon substrate, and a pre-amplifier structure is fabricated on the second well 220. For example, a fabrication process provided in the invention is as follows: First, the first well 210 having the first conductivity type and the second well 220 having the second conductivity type are formed on the semiconductor substrate 200 of the first conductivity type by injecting particles of different conductivity types, and the bit lines 230 and bit line lead-out regions 240 are later formed on the first well 210 and the second well 220, respectively. Then, lines are etched on the first well 210 and the second well 220 along a direction of the bit line 230. After etching, a plurality of fin-shaped protrusions 300 are formed on the wells, and each protrusion 300 is divided into two portions, namely a first sub-protrusion 310 and a second sub-protrusion 320. The first sub-protrusion 310 is located on the first well 210, and the second sub-protrusion 320 is located on the second well 220. Subsequently, word lines and/or memory cells 110 may be formed on the first sub-protrusions 310, and the pre-amplifiers 120 may be formed on the second sub-protrusions 320. FIG. 7A is a schematic sectional view of a first well 210 after etching according to some embodiments of the invention. FIG. 7B is a top view of the first well 210 after etching according to some embodiments of the invention. A cutting line in FIG. 7B is a cutting line of a section in FIG. 7A. FIG. 8A is a schematic sectional view of a second well 220 after etching according to some embodiments of the invention. FIG. 8B is a top view of the second well 220 after etching according to some embodiments of the invention. A cutting line in FIG. 8B is a cutting line of a section in FIG. 8A.

Figure 9A:
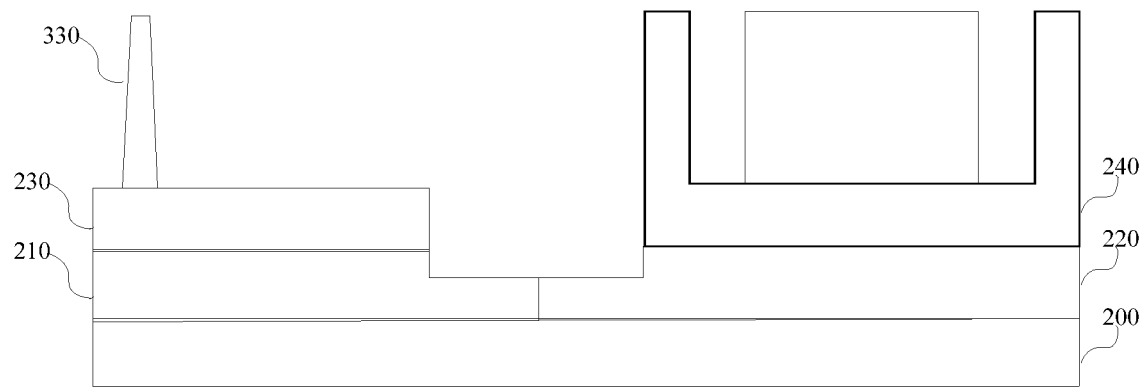
FIG. 9A is another schematic sectional view of a first well after etching according to some embodiments of the invention.
Figure 9B:
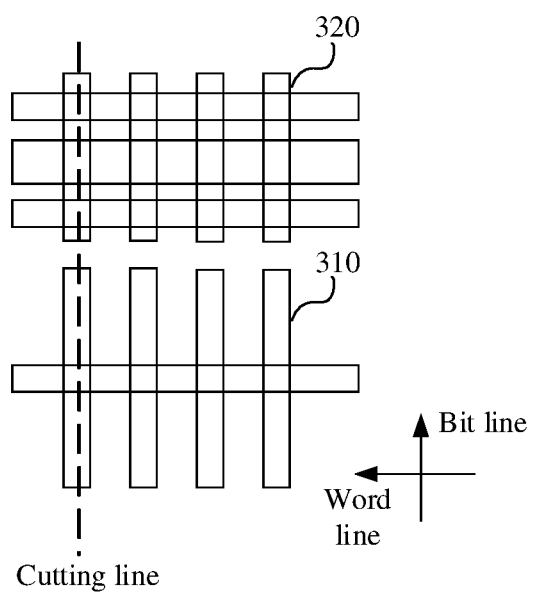
FIG. 9B is another top view of the first well after etching according to some embodiments of the invention.

Then, the fin-shaped protrusions 300 on the first well 210 and the second well 220 continue to be etched along a direction of a word line, and an etching depth is shallower than that of the fin-shaped protrusions 300, such that original protrusions 300 are etched into a plurality of columnar objects arranged in an array after etching. For example, when the wells are etched along the direction of the bit line 230, the etching depth may be 3000 A, and when the wells are etched along the direction of the word line, the etching depth may be 1000 A to 5000 A, e.g., 1500 A, 2000 A, or 3000 A, such that the etching depth of the word line is shallower than that of the bit line 230. In addition, conductive particles are injected between the bottoms of the columnar objects on the first well 210 and a surface of the first well 210 to form the buried bit lines 230. Conductive particles are injected between the bottoms of the columnar objects on the second well 220 and the surface of the second well 220 to form the bit line lead-out regions 240 corresponding to the bit lines 230, thereby forming a structure as shown in FIG. 9A. FIG. 9A is another schematic sectional view of the first well 210 after etching according to some embodiments of the invention. FIG. 9B is another top view of the first well 210 after etching according to some embodiments of the invention. A cutting line in FIG. 9B is a cutting line of a section in FIG. 9A. A formation process of the bit line lead-out regions 240 and the buried bit lines 230 is only an example, which is not specifically limited herein. Moreover, the bit lines 230 and the bit line lead-out regions 240 formed in the foregoing figures are in a one-to-one correspondence.

After the bit line lead-out regions 240 are formed, the following steps are performed to form the pre-amplifiers 120 located in the bit line lead-out regions 240: in the bit line lead-out regions 240, forming a fourth doped region 404 and a first doped region 401 having a second conductivity type, and a second doped region 402 and a third doped region 403 that are symmetrically located in the first doped region 401, where the first doped region 401, the second doped region 402, the third doped region 403, and the fourth doped region 404 are isolated, and the second doped region 402, the third doped region 403, and the fourth doped region 404 have the first conductivity type; and forming a first conductive plug 501 corresponding to the second doped region 402, a second conductive plug 502 corresponding to the third doped region 403, a third conductive plug 503 corresponding to a first predetermined surface region of the bit line lead-out region 240, and a fourth conductive plug 504 corresponding to a second predetermined surface region of the bit line lead-out region 240; forming a fifth conductive plug 505 corresponding to a third predetermined surface region on bit lines 230 corresponding to the plurality of bit line lead-out regions 240; and using the second well 220 as the emitters, the plurality of bit line lead-out regions 240 as the bases, and the first doped region 401 as the collectors to constitute the first transistors 121; and using the first doped region 401 as the bases, the second doped region 402 as the emitters, and the third doped region 403 as the collectors to constitute the second transistors 122.

Figure 10:
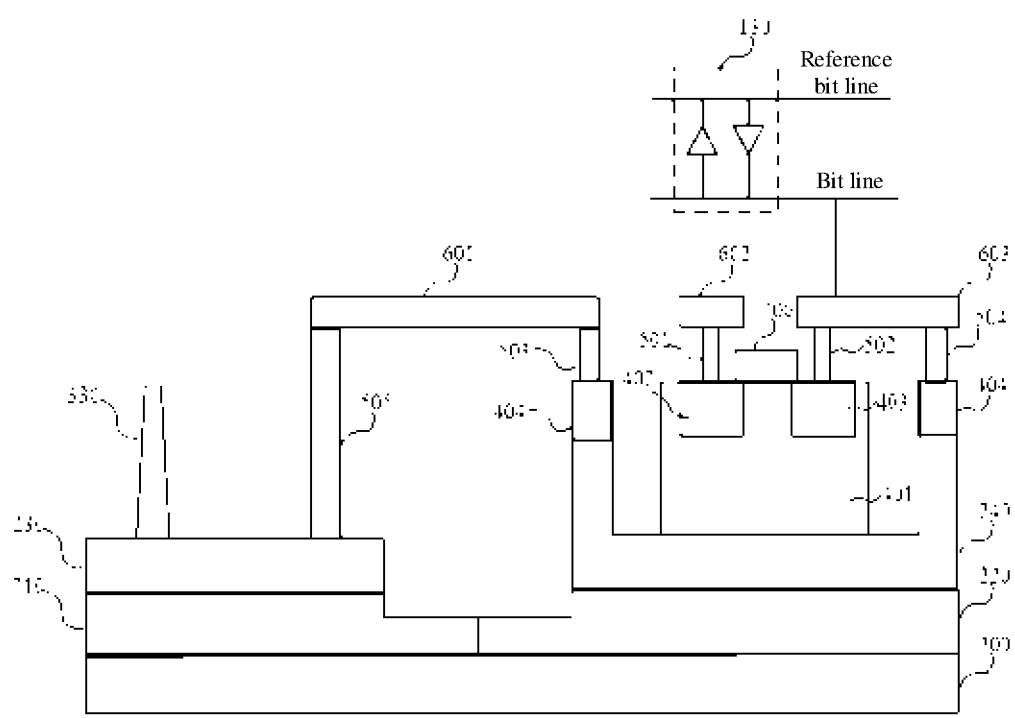
FIG. 10 is a schematic diagram of a structure of a semiconductor memory according to some embodiments of the invention.

For example, FIG. 10 is a schematic diagram of a structure of a semiconductor memory according to some embodiments of the invention. As shown in FIG. 10, when a dummy amplifier includes two transistors, the first doped region 401, the second doped region 402, the third doped region 403, and the fourth doped region 404 that are isolated are formed in the bit line lead-out regions 240. In addition, in the figure, two fourth doped regions 404 are formed in the bit line lead-out regions 240. The second doped region 402 and the third doped region 403 are symmetrically arranged in the first doped region 401, the second doped region 402, the third doped region 403, and the fourth doped region 404 have the first conductivity type, and the first doped region 401 has the second conductivity type. Then, the second well 220 may be used as emitters of the first transistors 121, the bit line lead-out regions 240 may be used as bases of the first transistors 121, and the first doped region 401 may be used as collectors of the first transistors 121. Then, the first doped region 401 is used as bases of the second transistors 122, the second doped region 402 is used as emitters of the second transistors 122, and the third doped region 403 is used as collectors of the second transistors 122 to constitute the second transistors 122, thereby forming the pre-amplifiers 120 in the second doped region 402.

Then, the first conductive plug 501, the second conductive plug 502, the third conductive plug 503, and the fourth conductive plug 504 are respectively formed on the second doped region 402, the third doped region 403, the first predetermined surface region (that is, a surface of the fourth doped region 404 on the left side in the figure) of the bit line lead-out regions 240, the second predetermined surface region (that is, a surface of the fourth doped region 404 on the right side in the figure) of the bit line lead-out regions 240. In addition, the fifth conductive plug 505 is formed on the predetermined region on the bit lines 230. The first conductive plug 501 is configured to connect to a first voltage reference, the second conductive plug 502 is connected to the sense amplifier 130 as an output terminal of the pre-amplifier 120, the third conductive plug 503 is connected to the bit lines 230 on the first well 210, and the fourth conductive plug 504 is connected to the sense amplifier 130.

In some examples, based on the foregoing fabrication method, if the first conductivity type is N-type, and the second conductivity type is P-type, the first transistor 121 is a PNP transistor, and the second transistor 122 is an NPN transistor; if the first conductivity type is P-type, and the second conductivity type is N-type, the first transistor 121 is an NPN transistor, and the second transistor 122 is a PNP transistor.

In some examples, to connect the conductive plugs, the connection may be achieved by forming metal layers on the conductive plugs. Specifically, a structure shown in FIG. 10 further includes three spaced metal layers formed, where the first metal layer 601 covers the fifth conductive plug 505 and the first conductive plug 501, the second metal layer 602 covers the first conductive plug 501, and the third metal layer 603 covers the second conductive plug 502 and the fourth conductive plug 504, thereby achieving the connection between the conductive plugs. In some examples, metal layers on the third conductive plug 503 and the fourth conductive plug 504 may be used to connect to the sense amplifier 130.

In some examples, the structure in FIG. 10 further includes a dummy gate 700. When the second transistor 122 is an NPN transistor, the dummy gate 700 may be used as a mask to form an NPN transistor. In addition, lead-out terminals of the bit line lead-out regions 240 may be connected to the bit lines 230 successively via the fourth doped region 404, the third conductive plug 503, the first metal layer 601, and the fifth conductive plug 505, and the pre-amplifiers 120 are fabricated on the bit line lead-out regions 240 on the second well 220. The second well 220 is connected to the first voltage reference as collectors of the first transistors 121, the second doped region 402 is connected to the second voltage reference as emitters of the second transistors 122, and the third doped region 403 is connected to the bit lines connected to which the sense amplifier 130 is connected, successively via the second conductive plug 502 and the third metal layer 603 as collectors of the second transistors 122. When the first transistor 121 is a PNP type and the second transistor is an NPN type, the second transistor may be formed by using a dummy MOS transistor parasitic BJT, and a switching transistor 112 gated by the word line may be a PMOS transistor. If the first transistor 121 is an NPN type and the second transistor is a PNP type, a switching transistor 112 gated by the word line may be an NMOS transistor.

In some examples, on the basis of the structure shown in FIG. 10, the switching transistor 112 and a capacitor 111 in the memory cell 110 may further be formed on a columnar structure 330 on the first well 210. For specific formation processes, reference may be made to descriptions in the related art, which is not repeated herein.

In addition, in a possible situation, first conductive plugs 501 corresponding to the plurality of pre-amplifiers 120 are all connected together, and the second metal layer 602 covers the plurality of first conductive plugs 501 to connect the plurality of first conductive plugs 501 together.

In a possible situation, to form the conductive plugs, the following steps may be used: first forming a dielectric layer on the bit lines 230 and the bit line lead-out regions 240; etching the dielectric layer, corresponding to the second doped region 402, the third doped region 403, the first predetermined surface region, the second predetermined surface region, and the third predetermined surface region, to form a first contact hole corresponding to the second doped region 402, a second contact hole corresponding to the third doped region 403, a third contact hole on the first predetermined surface region corresponding to the bit line lead-out regions 240, a fourth contact hole on the second predetermined surface region corresponding to the bit line lead-out regions 240, and a fifth contact hole on the third predetermined surface region on the bit lines 230 corresponding to the bit line lead-out regions 240; and filling the first contact hole, the second contact hole, the third contact hole, the fourth contact hole, and the fifth contact hole with a conductive dielectric to form the first conductive plug 501, the second conductive plug 502, the third conductive plug 503, the fourth conductive plug 504, and the fifth conductive plug 505. In practical applications, tungsten may be selected as the conductive dielectric for filling.

Those skilled in the art may readily figure out other embodiments of the invention after considering this specification and practicing the content disclosed herein. The invention is intended to cover any variations, purposes or applicable changes of the invention. Such variations, purposes or applicable changes follow the general principle of the invention and include common knowledge or conventional technical means in the technical field which is not disclosed in the invention. This specification and embodiments are merely considered as examples, and the true scope and spirit of the invention are defined by the appended claims.

It should be understood that the invention is not limited to the exact structure that has been described above and shown in the accompanying drawings, and various modifications and changes may be made without departing from the scope of the invention. The scope of the invention is defined only by the appended claims.

What is claimed is:

1. A sense amplifier circuit, comprising:
   an amplifier connected to a memory cell of a semiconductor memory; and
   a pre-amplifier located between the amplifier and the memory cell, wherein the pre-amplifier is configured to pre-amplify an electrical signal transmitted from the memory cell to the amplifier, the pre-amplifier is located on a bit line lead-out region corresponding to a bit line that corresponds to the memory cell, and the bit line is located on a silicon substrate, wherein the pre-amplifier comprises:
   a first transistor comprising a base connected to the memory cell and an emitter connected to a first voltage reference; and
   a second transistor comprising a base connected to a collector of the first transistor and emitter connected to a second voltage reference, and a collector connected to the amplifier.

2. The sense amplifier circuit according to claim 1, wherein the amplifier is connected to the bit line corresponding to the memory cell and a reference bit line, the memory cell comprises a capacitor and a switching transistor, one terminal of the capacitor is connected to one terminal of the switching transistor, a control terminal of the switching transistor is connected to a word line corresponding to the memory cell, and another terminal of the switching transistor is connected to the pre-amplifier.

3. The sense amplifier circuit according to claim 1, wherein the first transistor is a PNP transistor, and the second transistor is an NPN transistor.

4. The sense amplifier circuit according to claim 1, wherein the first transistor is an NPN transistor, and the second transistor is a PNP transistor.

5. A fabrication method for the sense amplifier circuit according to claim 1, the method comprising:
    forming a plurality of bit lines and a plurality of bit line lead-out regions corresponding to the plurality of bit lines on a silicon substrate;
    forming, on the plurality of bit lines, a plurality of memory cells of a semiconductor memory arranged in an array;
    forming a plurality of amplifiers, wherein the plurality of amplifiers is connected to the plurality of memory cells; and
    forming a plurality of pre-amplifiers on the plurality of bit line lead-out regions, wherein the plurality of pre-amplifiers is configured to pre-amplify electrical signals transmitted from the plurality of memory cells to the plurality of amplifiers.

6. The fabrication method according to claim 5, wherein:
    forming the plurality of memory cells of the semiconductor memory arranged in the array comprises:
        forming a plurality of bit lines and a plurality of bit line lead-out regions corresponding to the plurality of bit lines, with the plurality of bit lines and the plurality of bit line lead-out regions extending along a first direction, and the plurality of bit lines connected to respective columns of the plurality of memory cells, and
        forming, on the plurality of bit lines, the plurality of memory cells;
    forming the plurality of amplifiers comprises:
        forming the plurality of amplifiers, wherein the respective columns of the plurality of memory cells are in a one-to-one correspondence with the plurality of amplifiers; and
    forming the plurality of pre-amplifiers comprises:
        forming the plurality of pre-amplifiers on the plurality of bit line lead-out regions, wherein the plurality of bit line lead-out regions are in a one-to-one correspondence with the plurality of pre-amplifiers, input terminals of the plurality of pre-amplifiers are connected to bit lines in a corresponding column and output terminals of the plurality of pre-amplifiers, the output terminals of the plurality of pre-amplifiers are connected to the bit lines, the plurality of bit lines are connected to one terminals of the plurality of amplifiers, and other terminals of the plurality of amplifiers are connected to a reference bit line of the plurality of bit lines.

7. The fabrication method according to claim 6, wherein forming the plurality of pre-amplifiers on the plurality of bit line lead-out regions comprises:
    forming the plurality of pre-amplifiers comprising first transistors and second transistors on the plurality of bit line lead-out regions, wherein bases of the first transistors are connected to the plurality of memory cells, emitters of the first transistors are connected to a first voltage reference, bases of the second transistors are connected to collectors of the first transistors, emitters of the second transistors are connected to a second voltage reference, and collectors of the second transistors are connected to the plurality of amplifiers.

8. The fabrication method according to claim 7, wherein:
    forming the plurality of bit lines and the plurality of bit line lead-out regions corresponding to the plurality of bit lines comprises:
        forming a first well having a first conductivity type and a second well having a second conductivity type on a semiconductor substrate of a first conductivity type,
        forming the plurality of bit lines on the first well, and forming the plurality of bit line lead-out regions on the second well; and
    forming the plurality of pre-amplifiers in the plurality of bit line lead-out regions comprises:
        in the bit line lead-out region, forming a first doped region wherein the first doped region includes a second doped region and a third doped region, the second doped region and the third doped region are symmetrically located in the first doped region;
        in the bit line lead-out region, forming a fourth doped region, wherein the first doped region, the second doped region, the third doped region, and the fourth doped region are isolated, the second doped region, the third doped region, and the fourth doped region have a first conductivity type, the first doped region has a second conductivity type;
        forming a first conductive plug corresponding to the second doped region, a second conductive plug corresponding to the third doped region, a third conductive plug corresponding to a first predetermined surface region of the bit line lead-out region, and a fourth conductive plug corresponding to a second predetermined surface region of the bit line lead-out region;
        forming a fifth conductive plug corresponding to a third predetermined surface region on bit lines corresponding to the plurality of bit line lead-out regions;
        constituting the first transistors by using the second well as the emitters, the plurality of bit line lead-out regions as the bases, and the first doped region as the emitters; and
        constituting the second transistors using the first doped region as the bases, the second doped region as the emitters, and the third doped region as the collectors.

9. The fabrication method according to claim 8, wherein:
    in response to the first conductivity type being N-type, and the second conductivity type being P-type, constituting first transistors as PNP transistors, and constituting the second transistors as NPN transistors, and
    in response to the first conductivity type being P-type, and the second conductivity type being N-type, constituting the first transistors as NPN transistors, and constituting the second transistors as PNP transistors.

10. The fabrication method according to claim 8, further comprising:
    forming three spaced metal layers, wherein a first metal layer covers the fifth conductive plug and the first conductive plug, a second metal layer covers the first conductive plug, and a third metal layer covers the second conductive plug and the fourth conductive plug.

11. A method for operating a sense amplifier circuit, comprising:
   in response to a memory cell being selected, adjusting a connection line between an amplifier and the memory cell to float to a first voltage, wherein the first voltage has a voltage difference with respect to a predetermined voltage of the amplifier;
   obtaining a first superimposed voltage, wherein the first superimposed voltage is obtained by superimposing a first storage signal on the first voltage, the first superimposed voltage and the first voltage causes a pre-amplifier to stop operating, the pre-amplifier is located on a bit line lead-out region corresponding to a bit line that corresponds to the memory cell, and the bit line is located on a silicon substrate; and
   obtaining a second superimposed voltage to cause the pre-amplifier to pre-amplify an electrical signal transmitted from the memory cell to the amplifier, wherein the second superimposed voltage is obtained by superimposing a second storage signal on the first voltage.

12. The method according to claim 11, further comprising:
   in response to the memory cell not being selected, keeping the connection line between the amplifier and the memory cell at a predetermined voltage.

13. The method according to claim 11, wherein adjusting the connection line between the amplifier and the memory cell comprises:
   floating the connection line to the first voltage; and
   adjusting a bit line voltage of the bit line corresponding to the memory cell to which the amplifier is connected to float the bit line voltage to the first voltage, wherein the first voltage has a voltage difference with respect to the predetermined voltage of a reference bit line.

14. The method according to claim 13, wherein floating the connection line to the first voltage comprises:
   in response to the memory cell being in a reading phase:
      in response to the memory cell being selected, floating the connection line to the first voltage;
      adjusting a voltage of a first voltage reference to reverse bias a first transistor in cooperation with the first superimposed voltage, wherein the first transistor is a part of the pre-amplifier and the first transistor comprises a base connected to the memory cell and an emitter connected to the first voltage reference;
      forward biasing the first transistor in cooperation with the second superimposed voltage; and
      adjusting the voltage of the first voltage reference and a voltage of a second voltage reference such that the voltage of the first voltage reference cooperates with the first superimposed voltage or the second superimposed voltage to reverse bias the first transistor, and the voltage of the second voltage reference cooperates with the first superimposed voltage to reverse bias a second transistor, or cooperates with the second superimposed voltage to forward bias the second transistor, wherein the second transistor is a part of the pre-amplifier and the second transistor comprises a base connected to a collector of the first transistor, an emitter connected to the second voltage reference, and a collector connected to the amplifier; and
   in response to the memory cell being in a writing phase:
      in response to a column in which the memory cell is located being selected, adjusting the voltage of the first voltage reference to reverse bias the first transistor in cooperation with a writing signal on the connection line.

15. The method according to claim 14, wherein the first transistor is a PNP transistor, the second transistor is an NPN transistor, and the first voltage has a forward voltage difference with respect to the predetermined voltage.

16. The method according to claim 14, wherein the first transistor is an NPN transistor, the second transistor is a PNP transistor, and the first voltage has a reverse voltage difference with respect to the predetermined voltage.

17. The method according to claim 14, wherein voltage potentials of the first voltage reference and the second voltage reference are kept equal at a same time.

18. The method according to claim 11, wherein the first voltage has a forward voltage difference with respect to the predetermined voltage and the second voltage is greater than an average value of potentials corresponding to a first signal of a capacitor and a second signal of the capacitor, wherein the capacitor is a part of the memory cell.

19. The method according to claim 11, wherein the first voltage has a reverse voltage difference with respect to the predetermined voltage, and the second voltage is less than an average value of potentials corresponding to a first signal of a capacitor and a second signal of the capacitor, wherein the capacitor is a part of the memory cell.

* * * * *